United States Patent
Derbenwick et al.

(10) Patent No.: US 6,178,138 B1
(45) Date of Patent: Jan. 23, 2001

(54) ASYNCHRONOUSLY ADDRESSABLE CLOCKED MEMORY DEVICE AND METHOD OF OPERATING SAME

(75) Inventors: Gary F. Derbenwick, Colorado Springs; David A. Kamp, Monument; Michael V. Cordoba; Ryan T. Hirose, both of Colorado Springs, all of CO (US)

(73) Assignee: Celis Semiconductor Corporation, Colorado Springs, CO (US)

( * ) Notice: Under 35 U.S.C. 154(b), the term of this patent shall be extended for 0 days.

(21) Appl. No.: 09/400,212

(22) Filed: Sep. 21, 1999

(51) Int. Cl.[7] .................................................... G11C 8/00
(52) U.S. Cl. .................. 365/233; 365/145; 365/194; 365/230.8; 365/233.5
(58) Field of Search .................................. 365/233, 233.5, 365/230.08, 194, 145, 129, 189.01, 230.01

(56) References Cited

U.S. PATENT DOCUMENTS

| | | | |
|---|---|---|---|
| 5,548,560 | * 8/1996 | Stephens, Jr. et al. | 365/145 |
| 5,574,679 | * 11/1996 | Ohtsuki et al. | 365/233.5 |
| 5,740,115 | * 4/1998 | Ishibashi et al. | 365/145 |
| 5,907,861 | * 5/1999 | Seyyedy | 771/203 |
| 5,991,188 | * 12/1999 | Chung et al. | 365/145 |
| 5,999,438 | * 12/1999 | Ohsawa | 365/145 |

* cited by examiner

*Primary Examiner*—David Nelms
*Assistant Examiner*—Hoai V. Ho
(74) *Attorney, Agent, or Firm*—Duft, Graziano & Forest, P.C.

(57) ABSTRACT

A timing circuit produces a clock signal. An address buffer circuit receives and stores a first address in a first latch and a second address in a second latch asynchronously with respect to the clock signal. A memory control circuit associated with an array of memory cells accesses a first memory cell in the array corresponding to the first address in a first clocked access cycle, and accesses a second memory cell in the array corresponding to the second address in a second clocked access cycle. If a further address is asynchronously received before said second access cycle, the further address replaces the second address in the second latch.

34 Claims, 5 Drawing Sheets

US 6,178,138 B1

ASYNCHRONOUSLY ADDRESSABLE CLOCKED MEMORY DEVICE AND METHOD OF OPERATING SAME

BACKGROUND OF THE INVENTION

1. Field of the Invention

The present invention relates to integrated circuit devices and methods of operation thereof, and more particularly, to integrated circuit memory devices having clocked access cycles and methods of operation thereof.

2. Statement of the Problem

Integrated circuit memory devices are used to store information in a wide variety of electronic devices including, among others, personal computers, personal digital assistants, cellular radiotelephones and the like. For example, an integrated circuit memory device may be used to store data for retrieval and processing by a microprocessor or similar data processing device. To read data stored in a memory cell of a memory device, the microprocessor typically supplies an address to an address input of the integrated circuit device, e.g., drives an address bus to which the microprocessor and the memory device are connected, the signals applied to the address bus corresponding to the desired memory cell. In response, the memory device produces the data stored in the desired cell at an output port, e.g., drives a data bus connecting the memory and the microprocessor with signals corresponding to the data stored in the desired memory cell. As the design of microprocessor systems has advanced, the demands on memory devices have increased. In particular, higher processor speeds have led to demands for increased data throughput between memory devices and processors.

Many integrated circuit memory devices operate according to a clocked memory access cycle. For example, ferroelectric random access memory (FeRAM) devices typically operate according to an access cycle that is controlled by a memory clock signal which may be externally supplied or internally generated. After an externally supplied address is used to generate internal row and column addresses, the state of a ferroelectric memory element, e.g., a ferroelectric capacitor, is sensed, typically by measuring charge transfer from the ferroelectric element. The sensing operation may be destructive, e.g., the charge transfer may result in a change of the polarization state of the ferroelectric capacitor. Accordingly, the access cycle often includes a restore cycle in which the original polarization of the ferroelectric capacitor is restored. Synchronous memory devices, such as synchronous dynamic random access memory (SDRAM) devices and synchronous static random access memory (SSRAM) devices, may also use a clocked access cycle controlled by a memory clock signal.

In many nonvolatile and static memory applications, however, synchronous operation between a memory device and external devices may not be desirable. In such applications, a read cycle may be initiated simply by asserting a Chip Enable ($\overline{CE}$) signal and applying an address signal to a memory device's address input to access the addressed memory cell. In response, a signal corresponding to the contents of the addressed memory cell is asserted at an output port of the memory device within tens of nanoseconds of the address assertion. A new memory cell can be accessed by holding the signal constant and asserting a new address at the address input in a generally asynchronous manner.

Accordingly, in many memory applications it is desirable to access a memory device in an asynchronous manner, i.e., without requiring dependence on a common clock signal. Unfortunately, many memory devices that may be well suited for static memory applications, such as ferroelectric memory devices, are more desirably operated according to a clocked access cycle.

SUMMARY OF THE INVENTION

In light of the foregoing, it is an object of the invention to provide clocked integrated circuit memory devices and methods of operation therefor that can provide an asynchronous interface to external devices.

It is another object of the invention to provide ferroelectric integrated circuit memory devices and methods of operation that can provide an asynchronous interface to external devices.

A further object of the invention is to provide an asynchronously addressable clocked controller and methods of operation for such a controller.

These and other objects, features and advantages are provided according to the invention by integrated circuit memory devices and methods in which memory cells in a memory array are accessed by an asynchronously addressable clocked memory controller, i.e., a memory controller that receives address inputs asynchronously with respect to a memory clock signal that controls access to the memory array.

The invention provides an integrated circuit memory device comprising: an external signal input for receiving an externally supplied address signal; a timing circuit for providing a clock signal; a memory array including a plurality of memory cells; and an asynchronously addressable clocked memory controller communicating with the external signal input and the memory array and responsive to the timing circuit for receiving an externally supplied address asynchronously with respect to the memory clock signal and for accessing a selected memory cell associated with the address synchronously with respect to the memory clock signal. Preferably, the asynchronously addressable clocked memory controller comprises: a clocked memory control circuit responsive to the clock signal and communicating with the memory array for accessing the selected memory cell during an access cycle of the memory array; and an asynchronous address buffer circuit communicating with the input for receiving the address asynchronously with respect to the clock signal and communicating with the clocked memory control circuit to apply the address to the clocked memory control circuit. Preferably, the asynchronous address buffer circuit comprises: a first electronic storage element for storing a first one of the externally supplied addresses; and a second electronic storage element for storing a second one of the externally supplied addresses. Preferably, the first and second electronic storage elements comprise latches. Preferably, the asynchronous address buffer circuit comprises an address transition detector for providing an address detect signal upon receipt of the externally supplied address. Preferably, the asynchronous address buffer circuit comprises: an electronic storage element for storing the externally supplied address; an input switch between the input and the first electronic storage element; and the address transition detector applies the address detect signal to the input switch. Preferably, the asynchronous address buffer circuit further comprises: an output switch between the first electronic storage element and the clocked memory control circuit; and a memory access cycle timer responsive to the address detect signal for applying an address select signal to the output switch.

Preferably, the asynchronous address buffer circuit further comprises: a first electronic storage element for storing a first externally supplied address and a second electronic storage element for storing a second externally supplied address; a first input switch between the input and the first electronic storage element and a second input switch between the input and the second electronic storage element; a first output switch between the first electronic storage element and the clocked memory control circuit; a second output switch between the second electronic storage element and the clocked memory control circuit; and the memory access cycle timer is responsive to a first address detect signal for applying a first address select signal to the first output switch and is responsive to a second address detect signal for applying a second address select signal to the second output switch. Preferably, a clocked memory control circuit accesses a first selected memory cell associated with the first address during a first access cycle of the memory array and accesses a second selected memory cell associated with the second address during a second access cycle of the memory array. Preferably, the clocked memory control circuit accesses a first selected memory cell associated with a first asynchronously received address during a first access cycle of the memory array and accesses a second selected memory cell associated with a second asynchronously received address during a second access cycle of the memory array. Preferably, the access cycle includes a destructive read out cycle. Preferably, the memory cells include a ferroelectric memory element.

The invention also provides a ferroelectric integrated circuit memory device, comprising: an external signal input for receiving an externally supplied address signal; a timing circuit for providing a clock signal; a memory array including a plurality of ferroelectric memory elements; a clocked memory control circuit responsive to the clock signal and communicating with the memory array for accessing one of the memory cells during an access cycle of the memory array; and an asynchronous address buffer circuit communicating with the input for receiving the address asynchronously with respect to the clock signal and for applying the address to the clocked memory control circuit. Preferably, the asynchronous address buffer circuit comprises an address transition detector.

In another aspect, the invention provides an asynchronously addressable clocked controller comprising: a timing circuit for providing a clock signal; a receiving circuit for receiving an externally supplied address asynchronously with respect to the clock signal; and an output circuit for outputting the address synchronously with respect to the clock signal. Preferably, the receiving circuit comprises an address transition detector. Preferably, the receiving circuit comprises a first electronic storage element for storing a first one of the externally supplied addresses and a second electronic storage element for storing a second one of the externally supplied addresses.

In a further aspect, the invention also provides a method of operating an integrated circuit memory device including a memory array including a plurality of memory cells, the method comprising the steps of: providing a clock signal; receiving an externally supplied address asynchronously with respect to the clock signal; and accessing a selected memory cell in the memory array associated with the address synchronously with respect to the clock signal. In another aspect, the invention further includes the step of storing the address between the steps of receiving and accessing. Preferably, the step of storing is performed asynchronously with respect to the clock signal. Preferably, the step of storing comprises the steps of: detecting a first address signal and producing a first address detect signal; and routing the first address signal to an electronic storage element in response to the first address detect signal. Preferably, the step of storing further comprises the steps of: detecting a further address signal and producing a further address detect signal; and replacing the first address signal in the electronic storage element with the further address signal in response to the further address detect signal. Preferably, the step of accessing comprises the steps of: producing an address select signal; and routing the address signal to the memory array in response to the address select signal. Preferably, the step of receiving comprises receiving a first address and a second address; and the step of accessing comprises accessing a first selected memory cell associated with the first address in a first memory access cycle and accessing a second selected memory cell associated with the second address in a second memory access cycle. Preferably, the step of accessing comprises the steps of: reading the selected memory cell to change its state from a first logical state to a second logical state; and then restoring the selected memory cell to the first logical state. Preferably, the plurality of memory cells comprises a plurality of ferroelectric memory elements, and the step of reading comprises the step of changing the ferroelectric memory element of the selected memory cell from a first polarization state to a second polarization state; and the step of restoring comprises the step of restoring the ferroelectric memory element of the selected memory cell to the first polarization state.

In addition, the invention provides a method of operating an asynchronously addressable clocked controller, the method comprising the steps of: providing a clock signal; receiving an externally supplied address asynchronously with respect to the clock signal; and outputting the address synchronously with respect to the clock signal. Preferably, the method further includes the step of storing the address between the steps of receiving and outputting. Preferably, the step of storing is performed asynchronously with respect to the clock signal. Preferably, the step of storing comprises the steps of: detecting a first address signal transition and producing a first address detect signal; and routing the first address signal to an electronic storage element in response to the first address detect signal. Preferably, the step of storing further comprises the steps of: detecting a further address signal transition and producing a further address detect signal; and replacing the first address signal in the electronic storage element with the further address signal in response to the further address detect signal. Preferably, the step of outputting comprises the steps of: producing an address select signal; and outputting the address signal in response to the address select signal.

Numerous other features, objects and advantages of the invention will become apparent from the following description when read in conjunction with the accompanying drawings.

DETAILED DESCRIPTION OF THE PREFERRED EMBODIMENT

Figure 1:
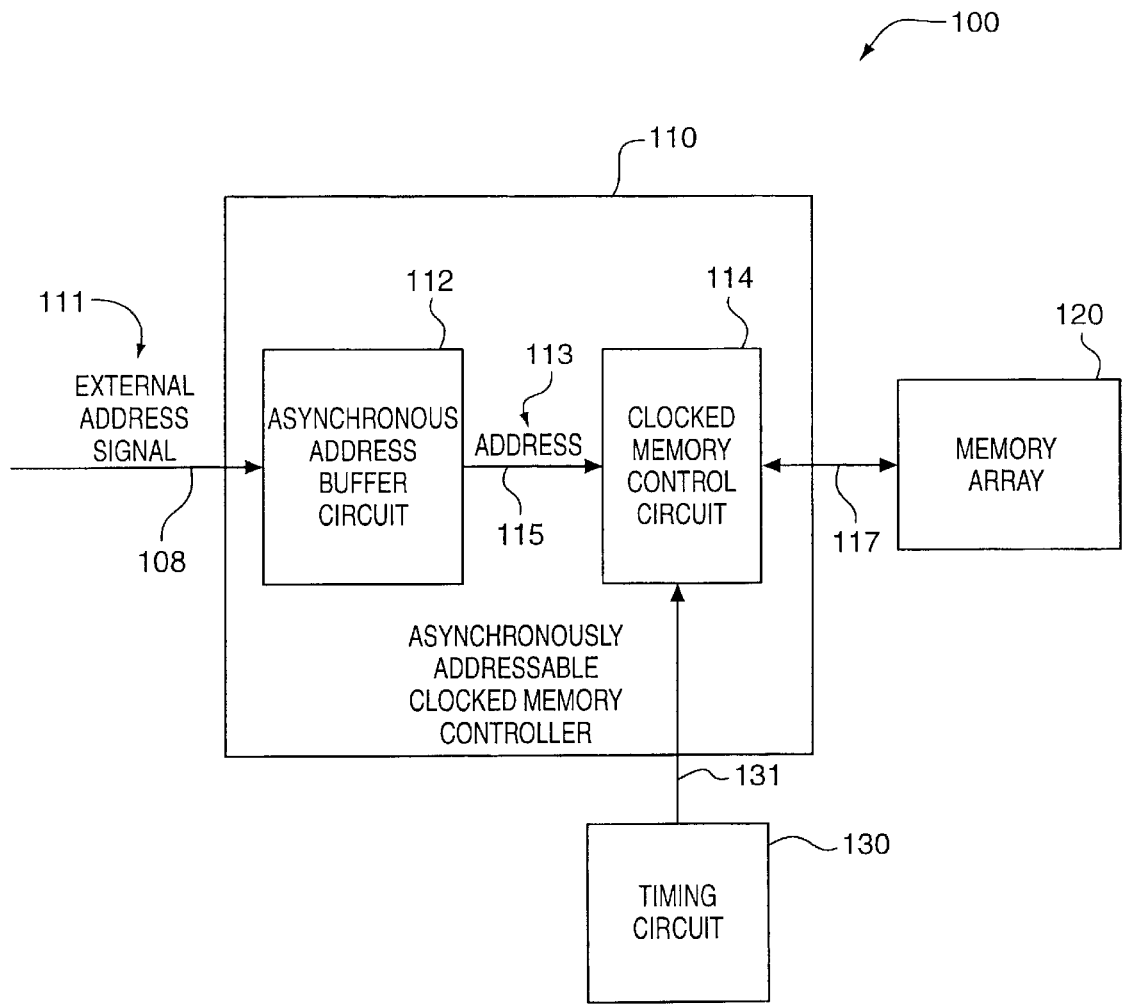
FIG. 1 is a generalized schematic diagram illustrating a preferred embodiment of integrated circuit memory device according to the present invention.

The present invention now will be described more fully hereinafter with reference to the accompanying drawings, in which embodiments of the invention are shown. Those skilled in the art will appreciate that the invention may be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Referring to FIG. 1, an embodiment of an integrated circuit memory device 100 according to the present invention includes an asynchronously addressable clocked memory controller 110 which is configured to access memory cells in a memory array 120, responsive to an external address signal 111 received on external address signal input 108 and a memory clock signal on line 131 produced by a timing circuit 130.

The asynchronously addressable clocked memory controller 110 includes clocked memory control circuit 114, which is responsive to the memory clock signal on line 131 and communicates with the memory array 120 via line 117. The clocked memory control circuit 114 accesses a selected memory cell of the memory array 120 synchronously with respect to the memory clock signal 331 (FIG. 3) on line 131 according to an address 113 applied to the clocked memory control circuit 114 during an access cycle. An asynchronous address buffer circuit 112 is operatively associated with the clocked memory control circuit 114. The asynchronous address buffer circuit 112 receives the external address signal 111 on input 108, stores a corresponding address asynchronously with respect to the memory clock signal on line 131, and applies the stored address 113 to the clocked memory control circuit 114 during a subsequent access cycle.

The timing circuit 130 illustrated in FIG. 1 may comprise, for example, a clock signal generation circuit which generates the memory clock signal 331 internally on the integrated circuit memory device 100. However, the timing circuit 130 may comprise a clock buffering circuit which receives and buffers a clock signal supplied from a source external to the integrated circuit memory device 100. According to an embodiment of the present invention, described in greater detail below with reference to FIG. 3, the timing circuit 130 may be integrated with the asynchronous address buffer circuit 112 which includes a memory access cycle timer 320 which includes the timing circuit 130 that produces the memory clock signal 331.

Figure 2:
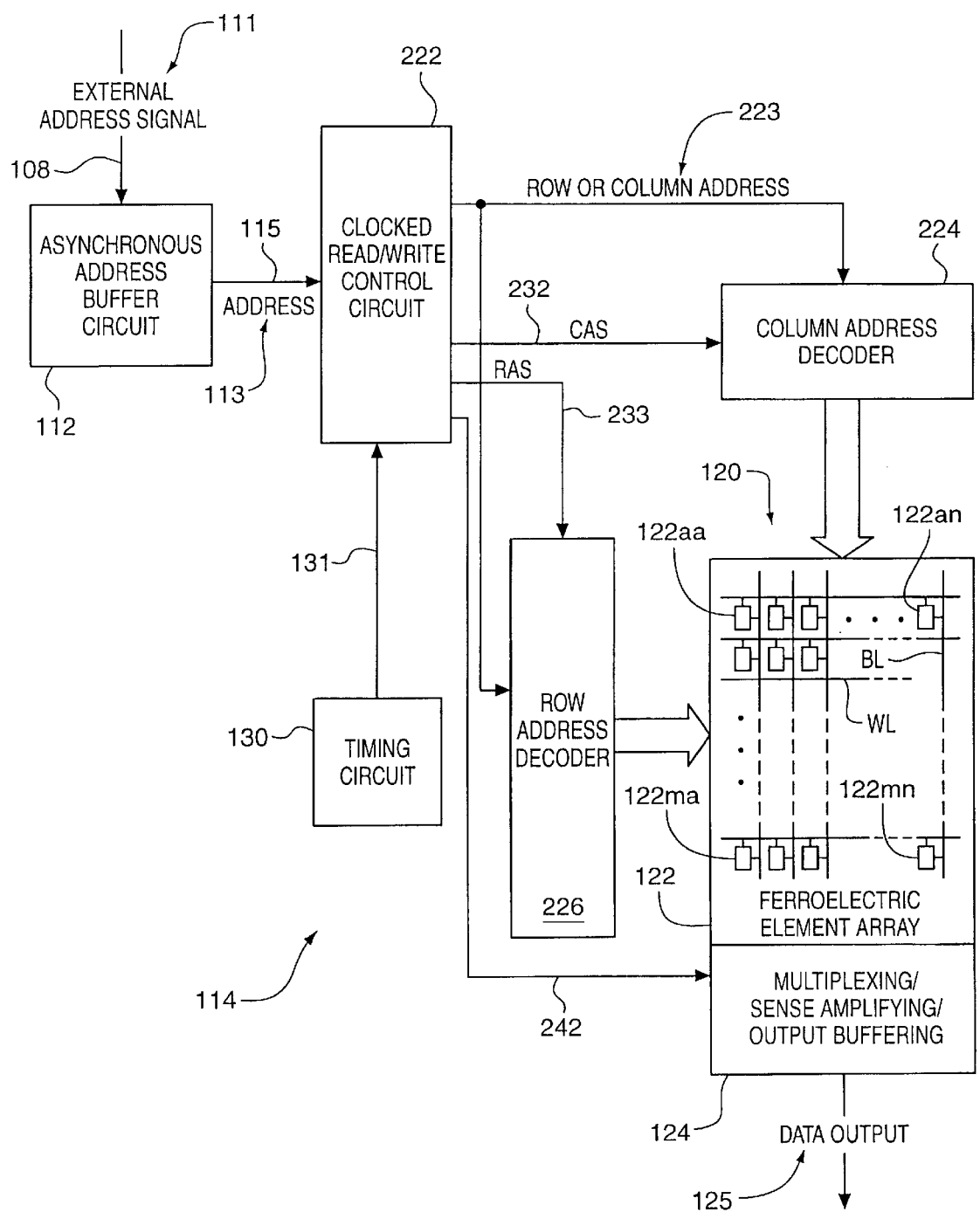
FIG. 2 is a more detailed schematic diagram of the memory device of FIG. 1, illustrating an embodiment of the memory device utilized in a ferroelectric integrated circuit memory.

FIG. 2 illustrates portions of an exemplary clocked memory control circuit 114, in particular, a memory control circuit for a ferroelectric integrated circuit memory device. Responsive to the applied address 113 and to the memory clock signal on line 131, a clocked read/write control circuit 222 generates row or column address signals 223, along with control signals such as a row address strobe signal RAS on line 232 and a column address strobe signal CAS on line 233 which control operation of row and column address decoders 224, 226 in a manner which is well known to those skilled in the art and need not be discussed in greater detail herein.

During a read cycle portion of the access cycle, the row and column address decoders 224, 226 produce appropriate signals on word and bit lines WL, BL connected to memory cells, e.g., ferroelectric memory elements 122aa–122mn of a ferroelectric element array 122. In FIG. 2, those skilled in the art will appreciate that the clocked read/write control circuit 222 usually also generates other control signals on line 242 that control switching, sense amplifying and output buffering circuitry 124 connected to the ferroelectric element array 122, thus performing a read operation on a selected element of the plurality of ferroelectric memory elements 122aa - 122mn and producing an output 125 corresponding to the information stored in the selected memory element. As reading of the selected ferroelectric memory element may change the polarization state of the selected ferroelectric element from a first polarization state to a second polarization state, the access cycle may include a restore cycle during which the polarization state of the selected ferroelectric memory element is restored to the first polarization state. Those skilled in the art will appreciate that FIG. 2 illustrates a representative ferroelectric clocked memory architecture, and that a variety of other clocked memory architectures may be employed with the present invention. For example, the present invention may be applied to an architecture that uses conventional capacitor-type memory cells.

Figure 3:
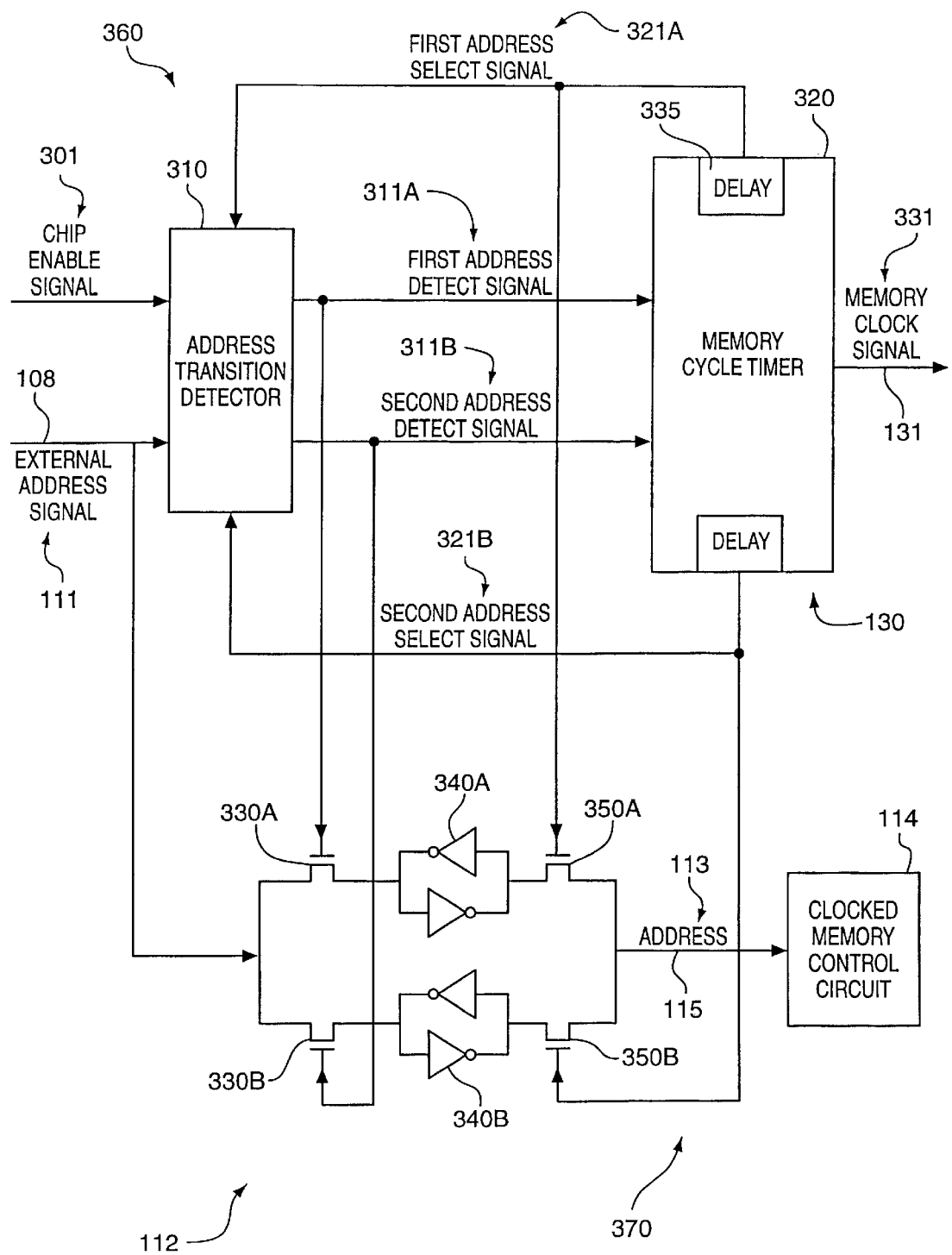
FIG. 3 is a schematic diagram illustrating a preferred embodiment of an asynchronous address buffer circuit of the memory of FIG. 2.
Figure 4:
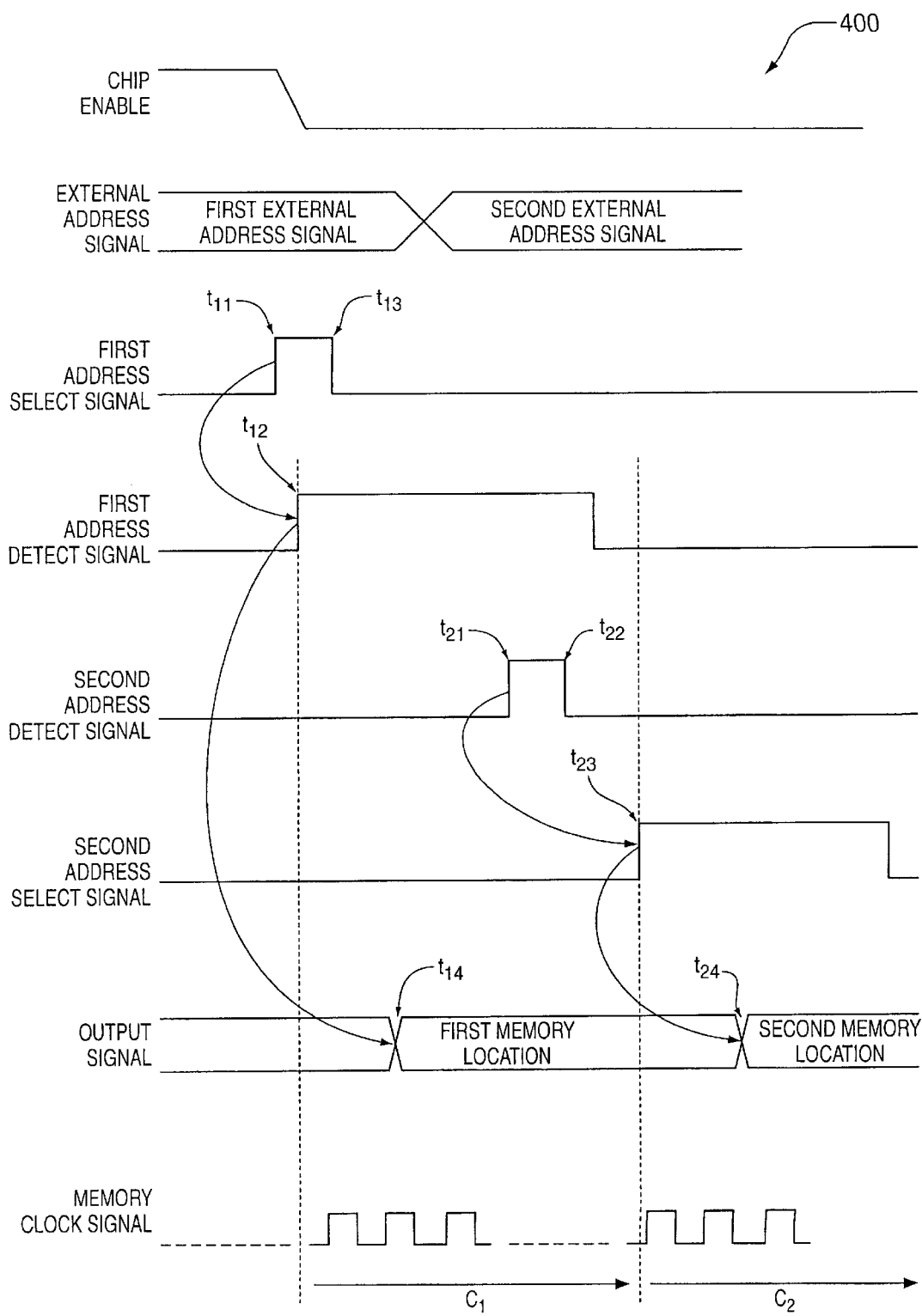
FIG. 4 is a timing diagram illustrating operations for accessing a memory cell in an integrated circuit memory device according to an aspect of the present invention.

FIGS. 3 and 4, respectively, illustrate an exemplary embodiment of an asynchronous address buffer circuit 112 according to the present invention and exemplary operations 400 thereof. After a signal is asserted on a chip enable line 301, an address transition detector 310 detects a first external address signal 111, e.g., detects a signal transition on an externally supplied address input 108, and in response asserts a first address detect signal 311A at a time $t_{11}$. Assertion of the first address detect signal 311A also causes a first input switch 330A, preferably a transistor, to route the external address signal to a first electronic storage element, which preferably is a first latch 340A, where it is stored upon deassertion of the first address detect signal 311A at a time $t_{13}$. In response to assertion of the first address detect signal 311A, a memory access cycle timer 320 asserts a first address select signal 321A at time $t_{12}$ that causes a first output switch 350A, preferably a transistor, to apply the first address stored in the first latch 340A to the clocked memory control circuit 114, via output line 115, thus initiating a read cycle portion of the first access cycle $C_1$. Memory access cycle timer 320 includes a delay circuit 335 which permits the first address select signal 321A to be asserted with a suitable delay after the first address detect signal 311A to permit the address to settle. Preferably, this time is from 2 nanoseconds to about 25 nanoseconds, and most preferably about 10 nanoseconds. At a time $t_{14}$ after assertion of the first address select signal 321A, data corresponding to the selected memory cell is produced in a first clock access cycle $C_1$ controlled by the clocked memory control circuit 114 according to the memory clock signal on line 131. The first access cycle $C_1$ may include a restore or refresh cycle that follows the read cycle. During the restore or refresh cycle, for example, the clocked memory control circuit 114 may apply an appropriate restoring voltage to a ferroelectric memory element to restore the polarization of the element to the state it possessed before the start of the read cycle.

During the first access cycle $C_1$, a second external address signal is detected and a second address detect signal 311B is asserted in response thereto at a time $t_{21}$. Assertion of the second address detect signal 311B causes a second input switch 330B, preferably a transistor, to route the second external address signal to a second electronic storage element, which is preferably a second latch 340B, where a second address is stored upon deassertion of the second address detect signal 311B at time $t_{22}$. Storage of the second address occurs generally asynchronous to, i.e., without logical dependence upon, the memory clock signal 331 on line 131. At a time $t_{23}$ following completion of the first access cycle $C_1$, the memory access cycle timer 320 asserts a second address select signal 321B in response to the second address detect signal 311B, causing a second output switch 350B, preferably a transistor, to apply the second stored address to the clocked memory control circuit 114. The second address select signal 321B is preferably asserted with a minimum delay, provided by delay circuit 335, after the second address detect signal 311B to permit the address to settle. Preferably, this time is as described above. However, since the second address select signal 321B is not asserted until the completion of the first access cycle $C_1$, which, generally, will be significantly longer than the delay, the delay to allow the address to settle is not a factor unless the second external address is detected less than the delay period prior to the completion of the first access cycle $C_1$. At a time $t_{24}$ after assertion of the second address select signal 321B, data corresponding to a selected memory cell are produced during a second clock access cycle $C_2$.

Referring to the memory access cycles described above, if the second address detect signal 311B is not asserted during the first clock cycle $C_1$, the memory access cycle timer 320 will forego assertion of the second address select signal 321B and suspend the memory clock signal 331 following completion of the first memory clock cycle $C_1$. This failure to assert the second address select signal will also cause the address transition detector 310 to "reset," e.g., to respond to a next address signal asserted on the external address line 302 following completion of the first address cycle $C_1$ by asserting the first address detect signal 311A, triggering regeneration of the memory clock signal 331 and initiating a new memory access cycle.

Those skilled in the art will appreciate that the address transition detector 310, the memory access cycle timer 320, the switches 330A, 330B, 350A, 350B, and the latches 340A, 340B may be implemented using a wide variety of well-known circuit designs, the detailed structure and operation of which need not be discussed in greater detail herein. It will also be understood that a variety of alternate or additional operations other than those illustrated in FIG. 4 also fall within the scope of the present invention. For example, a third external address signal may be asserted on the external address line 302 during the first access cycle $C_1$. In response, a corresponding third address may be stored in the second latch 340B, replacing the second address. This third address would then be accessed during the second access cycle $C_2$. Similarly, an additional external address signal could subsequently be asserted during the first access cycle $C_1$, causing a corresponding address to be stored, replacing a previously stored and pending address, and a corresponding memory cell to be accessed during a subsequent memory access cycle. That is, no matter how many external address signals are applied during a given cycle, the memory 100 applies the latest one for which enough time has elapsed for the signal to settle on the address lines to the clocked memory control circuit 114, and thus to the memory array 120.

As described above, the memory clock signal 331 used to control the clocked memory control circuit 114, in the preferred embodiment shown, is produced by the memory access cycle timer 320, thus integrating functions of the timing circuit 130 of FIG. 1 with those of the asynchronous address buffer circuit 112. Thus, it is seen that the asynchronously addressable buffer circuit 112 includes a receiving circuit 360 for receiving an externally supplied address asynchronously with respect to the clock signal 331 on line 131, and an output circuit 370, for outputting, on output line 115, the address synchronously with respect to the clock signal. In an alternative embodiment, the asynchronous address buffer circuit 112 outputs the address 113 asynchronously, and the clock signal is provided internally by clocked memory control circuit 114. That is, the address is presented on line 113 until such time as the clocked read/write control circuit 222 (FIG. 2) clocks it into the clocked portion 114, 130, 120 of the system 100. In this alternative embodiment, the receiving circuit would comprise the asynchronous address buffer circuit 112, and the output circuit would comprise the clocked memory control circuit 114.

Figure 5:
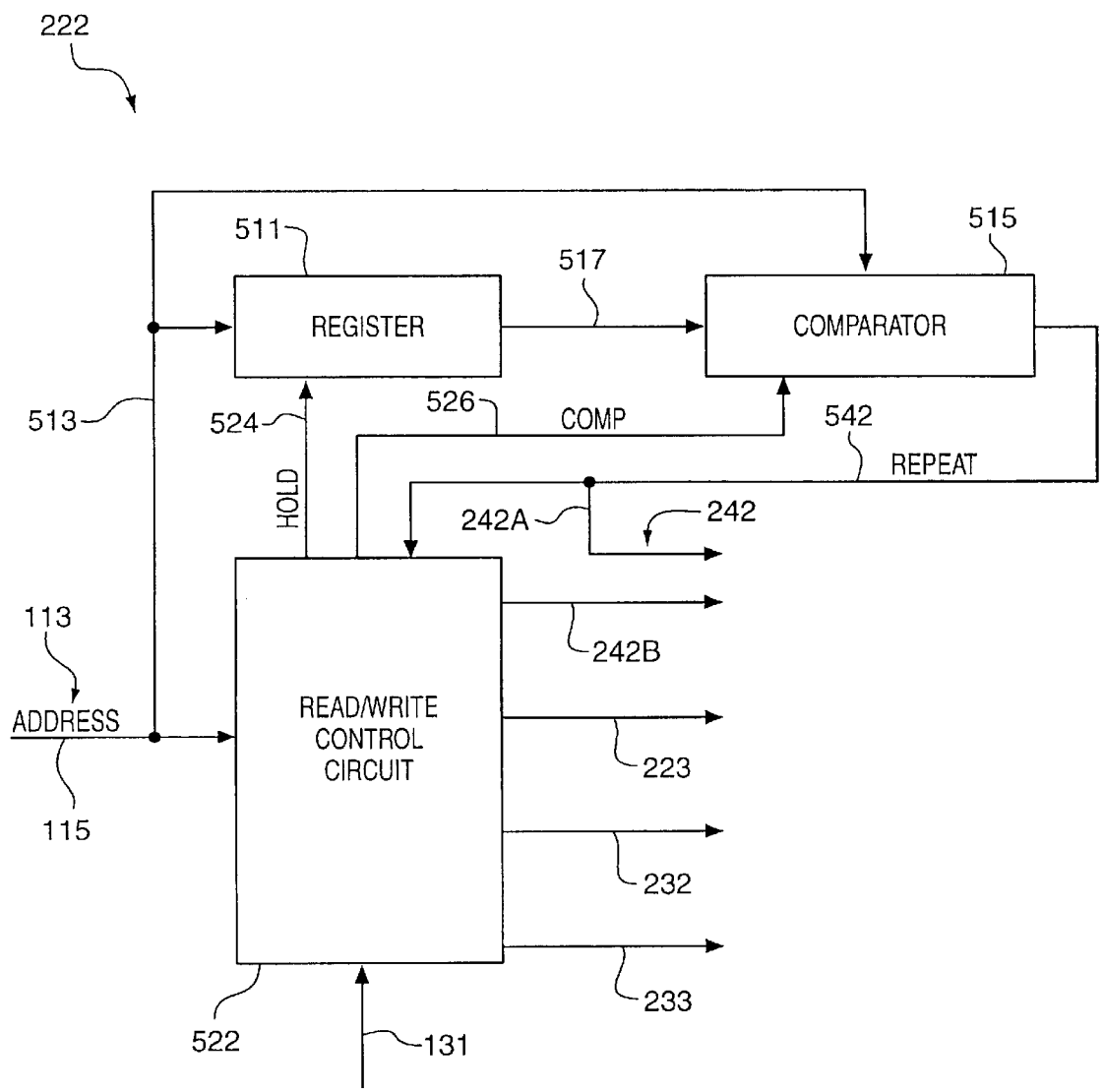
FIG. 5 is schematic diagram of an alternative preferred embodiment of the read/write control circuit of FIG. 2.

It sometimes occurs in an asynchronous memory that an external address signal 111 (FIG. 1) is left applied to the memory input 108 for some time, for example for hours or days, if someone leaves a memory operating without using it. This will not in general happen to a clocked memory. However, this is not a problem for the memory 100 according to the invention, since an address is entered into the latches 340A and 340B (FIG. 3) only after an address transition is detected by address transition detector 310. In certain asynchronous memories, it is possible to continuously reassert the same address if the memory is left on without being used. In this case, the address transition detector 310 would repeatedly detect a "new" address transition and the memory 100 as described up to this point could continually read the same memory cell. Since the read process is a destructive read in some ferroelectric memories, this would create a situation in which the data in a cell is continuously being destroyed and rewritten. Since some ferroelectric memories, such as PZT memories, fatigue, this is undesirable. Such a constant destruction and rewriting of data to a memory cell is avoided by utilizing a clocked read/write control circuit 222 as shown in FIG. 5. Clocked read/write control circuit 222 includes a register 511, a comparator 515, and a read/write control circuit 522. Read/write control circuit 522 has all of the functions as previously described for the clocked read/write control circuit 222 as well as other functions as described below. The address signal 113 from asynchronous address buffer circuit 112 is applied to register 511 and comparator 515 via line 513 as well as the read/write control circuit 522. Shortly into the clock access cycle, a hold signal is applied on line 524 by read/write control circuit 522. This hold signal causes register 511 to store and hold the current address 113 until after the clock address cycle for that address, i.e., $C_1$ or $C_2$ above, is completed, and for a sufficient time thereafter to ensure that it is held into the next clock cycle. Then, at the initiation of the next clock address cycle, the read/write control circuit 522 applies a comp signal on line 526 to comparator 515, which causes it to compare the address in register 511 with the new address 113. If these are the same, there is no need to read the memory again, and comparator 515 applies a repeat signal on line 542 to read/write control circuit 522, which causes it to abort the current clock access cycle. The repeat signal on line 542 is also applied to multiplexing/sense amplifying/output circuit 124, via line 242A, to cause it to output the previous data signal. Note that in this embodiment, line 242 in FIG. 2 includes both lines 242A and 242B in FIG. 5. If the address 113 is different than the address in register 511, then the read cycle proceeds as discussed above. Shortly into the next clock access cycle, the hold signal on line 524 is asserted, whereupon register 511 stores the then current address 113. The signals output on lines 223, 232, and 233 are as discussed above.

The drawings and specification of the present application disclose embodiments of the invention. Although specific terms are employed, they are used in a generic and descriptive sense only and not for purposes of limitation. It is expected that persons skilled in the art can and will make, use or sell alternative embodiments that are within the scope of the following claims either literally or under the Doctrine of Equivalents.

What is claimed is:

1. An integrated circuit memory device, comprising:
   an external signal input for receiving an externally supplied address signal;
   a timing circuit for providing a memory clock signal;
   a memory array including a plurality of memory cells; and
   an asynchronously addressable clocked memory controller communicating with said external signal input and said memory array and responsive to said timing circuit for receiving said externally supplied address asynchronously with respect to said memory clock signal and for accessing a selected memory cell associated with said externally supplied address synchronously with respect to said memory clock signal.

2. The device according to claim 1 wherein said asynchronously addressable clocked memory controller comprises:
   a clocked memory control circuit responsive to said clock signal and communicating with said memory array for accessing said selected memory cell during an access cycle of said memory array; and
   an asynchronous address buffer circuit communicating with said input for receiving said address asynchronously with respect to said clock signal and communicating with said clocked memory control circuit to apply said address to said clocked memory control circuit.

3. The device according to claim 2 wherein said asynchronous address buffer circuit comprises: a first electronic storage element for storing a first one of said externally supplied addresses; and a second electronic storage element for storing a second one of said externally supplied addresses.

4. The device according to claim 3 wherein said first and second electronic storage elements comprise latches.

5. A device according to claim 2 wherein said asynchronous address buffer circuit comprises an address transition detector for proving an address detect signal upon receipt of said externally supplied address.

6. The device according to claim 5 wherein said asynchronous address buffer circuit comprises: an electronic storage element for storing said externally supplied address; an input switch between said input and said first electronic storage element; and said address transition detector applies said address detect signal to said input switch.

7. The device according to claim 6 wherein said asynchronous address buffer circuit further comprises: an output switch between said first electronic storage element and said clocked memory control circuit; and a memory access cycle timer responsive to said address detect signal for applying an address select signal to said output switch.

8. The device according to claim 7 wherein said asynchronous address buffer circuit further comprises:
   a first said electronic storage element for storing a first externally supplied address and a second said electronic storage element for storing a second externally supplied address;
   a first said input switch between said input and said first electronic storage element;
   a second said input switch between said input and said second electronic storage element;
   a first said output switch between said first electronic storage element and said clocked memory control circuit;
   a second said output switch between said second electronic storage element and said clocked memory control circuit; and
   said memory access cycle timer is responsive to a first said address detect signal for applying a first said address select signal to said first output switch, and is responsive to a second said address detect signal for applying a second said address select signal to said second output switch.

9. The device according to claim 8 wherein said clocked memory control circuit accesses a first said selected memory cell associated with said first externally supplied address during a first said access cycle of said memory array, and accesses a second said selected memory cell associated with said second externally supplied address during a second said access cycle of said memory array.

10. The device according to claim 8 wherein said memory access cycle timer includes a delay circuit for delaying the application of said address select signal for a predetermined time after receiving said address detect signal.

11. The device according to claim 2 wherein said clocked memory control circuit accesses a first said selected memory cell associated with a first said asynchronously received address during a first access cycle of said memory array, and accesses a second said selected memory cell associated with a second said asynchronously received address during a second access cycle of said memory array.

12. The device according to claim 2 wherein said access cycle includes a destructive read out cycle.

13. The device according to claim 1 wherein said memory cells include a ferroelectric memory element.

14. A ferroelectric integrated circuit memory device, comprising:
   an external signal input for receiving an externally supplied address signal;
   a timing circuit for providing a clock signal;
   a memory array including a plurality of ferroelectric memory elements;
   a clocked memory control circuit responsive to said clock signal and communicating with said memory array for synchronously accessing one of said memory cells during an access cycle of said memory array; and
   an asynchronous address buffer circuit communicating with said input for receiving said address asynchronously with respect to said clock signal and for applying said address to said clocked memory control circuit.

15. The device according to claim 14 wherein said asynchronous address buffer circuit comprises an address transition detector.

16. An asynchronously addressable clocked controller, comprising;
   a timing circuit for providing a clock signal;
   a receiving circuit for receiving an externally supplied address asynchronously with respect to said clock signal; and
   an output circuit for outputting said address synchronously with respect to said clock signal.

17. The controller according to claim 16 wherein said receiving circuit comprises an address transition detector.

18. The controller according to claim 16 wherein said receiving circuit comprises a first electronic storage element for storing a first one of said externally supplied addresses and a second electronic storage element for storing a second one of said externally supplied addresses.

19. A method of operating an integrated circuit memory device including a memory array including a plurality of memory cells, the method comprising the steps of:

providing a clock signal;

receiving an externally supplied address asynchronously with respect to said clock signal; and accessing a selected memory cell in said memory array associated with said address synchronously with respect to said clock signal.

20. The method according to claim 19, and further including the step of storing said address between said steps of receiving and accessing.

21. The method according to claim 20 wherein said step of storing is performed asynchronously with respect to said clock signal.

22. The method according to claim 20 wherein said step of storing comprises the steps of:

detecting a first address signal and producing a first address detect signal; and routing said first address signal to an electronic storage element in response to said first address detect signal.

23. The method according to claim 22 wherein said step of storing further comprises the steps of:

detecting a further address signal and producing a further address detect signal; and replacing said first address signal in said electronic storage element with said further address signal in response to said further address detect signal.

24. The method according to claim 22 wherein said step of accessing comprises the steps of:

producing an address select signal; and routing said address signal to said memory array in response to said address select signal.

25. The method according to claim 19 wherein:

said step of receiving comprises receiving a first said address and a second said address; and said step of accessing comprises accessing a first said selected memory cell associated with said first address in a first memory access cycle and accessing a second selected memory cell associated with said second address in a second memory access cycle.

26. The method according to claim 19 wherein said step of accessing comprises the steps of:

reading said selected memory cell to change its state from a first logical state to a second logical state; and then restoring said selected memory cell to said first logical state.

27. The method according to claim 26 wherein said plurality of memory cells comprises a plurality of ferroelectric memory elements, and wherein:

said step of reading comprises the step of changing said ferroelectric memory element of said selected memory cell from a first polarization state to a second polarization state; and said step of restoring comprises the step of restoring said ferroelectric memory element of said selected memory cell to said first polarization state.

28. The method of operating an asynchronously addressable clocked controller, said method comprising the steps of:

providing a clock signal;

receiving an externally supplied address asynchronously with respect to said clock signal; and outputting said address synchronously with respect to said clock signal.

29. The method according to claim 28, and further including the step of storing said address between said steps of receiving and outputting.

30. The method according to claim 29 wherein said step of storing is performed asynchronously with respect to said clock signal.

31. The method according to claim 29 wherein said step of storing comprises the steps of:

detecting a first address signal transition and producing a first address detect signal; and routing said first address signal to an electronic storage element in response to said first address detect signal.

32. The method according to claim 31 wherein said step of storing further includes the step of delaying the routing of said first address signal for a predetermined time after said step of detecting.

33. The method according to claim 31 wherein said step of storing further comprises the steps of:

detecting a further address signal transition and producing a further address detect signal; and replacing said first address signal in said electronic storage element with said her address signal in response to said further address detect signal.

34. The method according to claim 28 wherein said step of outputting comprises the steps of:

detecting an address signal transition and producing an address detect signal;

producing an address select signal in response to said address detect signal; and outputting said address signal in response to said address select signal.

* * * * *